United States Patent [19]
Oostra et al.

[11] Patent Number: 5,354,696
[45] Date of Patent: Oct. 11, 1994

[54] METHOD OF MANUFACTURING A SEMICONDUCTOR DEVICE WITH A HETEROJUNCTION BY IMPLANTATION WITH CARBON-HALOGEN COMPOUND

[75] Inventors: Doeke Oostra, Eindhoven; Jozef J. M. Ottenheim, Roosendaal; Jarig Politiek, Eindhoven, all of Netherlands

[73] Assignee: U.S. Philips Corporation, New York, N.Y.

[21] Appl. No.: 95,978

[22] Filed: Jul. 22, 1993

[30] Foreign Application Priority Data

Jul. 24, 1992 [EP] European Pat. Off. ........ 92202275.1

[51] Int. Cl.$^5$ ........................................... H01L 21/268
[52] U.S. Cl. ..................................... 437/18; 437/933; 437/969
[58] Field of Search .................. 437/18, 24, 930, 933, 437/934, 959, 969; 148/DIG. 10, DIG. 40, DIG. 67, DIG. 151

[56] References Cited

U.S. PATENT DOCUMENTS

| | | | |
|---|---|---|---|
| 4,559,696 | 12/1985 | Anand et al. | 437/969 |
| 4,992,839 | 2/1991 | Shirai | 437/87 |
| 5,137,839 | 8/1992 | Niitsu | 437/24 |
| 5,158,897 | 10/1992 | Sato et al. | 437/18 |

FOREIGN PATENT DOCUMENTS

| | | |
|---|---|---|
| 0390522 | 10/1990 | European Pat. Off. |
| 61-97818 | 5/1986 | Japan ..................... 437/18 |

OTHER PUBLICATIONS

"Si Hetero-Bipolar Transistor with Fluorine-Doped SIC Emitter and a Thin, Highly Doped Epitaxial Base" Sugii et al., IEEE Transactions on Electron Devices, vol. 37, No. 11, Nov. 1990.

Primary Examiner—Tom Thomas
Assistant Examiner—Chandra Chaudhari
Attorney, Agent, or Firm—Steven R. Biren

[57] ABSTRACT

A method of manufacturing a semiconductor device in which a surface zone (3) adjoining a surface (2) is formed in a silicon semiconductor body (1) by local application of carbon and dopant atoms, the carbon atoms being provided by means of implantation (4). Halogen atoms are provided simultaneously with the carbon atoms by means of an implantation with ions of a carbon-halogen compound, after which a heat treatment is carried out such that non-bonded halogen atoms are removed from the surface zone (3). Such a method is suitable for making a surface zone (3) which has a greater bandgap than silicon. The surface (3) is suitable, for example, for making an emitter region of a heterojunction bipolar transistor (HBT).

8 Claims, 1 Drawing Sheet

METHOD OF MANUFACTURING A SEMICONDUCTOR DEVICE WITH A HETEROJUNCTION BY IMPLANTATION WITH CARBON-HALOGEN COMPOUND

BACKGROUND OF THE INVENTION

The invention relates to a method of manufacturing a semiconductor device whereby a surface zone adjoining a surface is formed in a silicon semiconductor body in that carbon and dopant atoms are provided locally, the carbon atoms being provided through implantation.

Such a method is suitable for manufacturing a surface zone whose material after implantation with the carbon atoms has a greater bandgap than the silicon of the semiconductor body. The surface zone may be used, for example, as an emitter region in a heterojunction bipolar transistor (HBT) or as a barrier in a "tunnelling hot electron transistor". The dopant atoms serve to determine the conductivity type of the surface zone. The material of the surface zone is given a certain conductivity type: p type or n type, in that dopant atoms are provided by diffusion or implantation in usual manner before or after implantation of the carbon. If the material of the semiconductor body now has an opposite conductivity type, a hetero pn junction is created between the surface zone and the semiconductor body. Such a junction may function, for example, as an emitter-base junction of a HBT. Transistors provided with such a heterojunction are fast and very efficient.

U.S. Pat. No. 4,559,696 discloses a method of the kind mentioned in the opening paragraph whereby the surface zone is formed through implantation with arsenic and carbon ions at an energy of approximately 100 keV in a dose of approximately $4 \cdot 10^{16}/cm^2$. A surface zone of n-type material having a greater bandgap than silicon is then created. The surface zone acts as the emitter of a HBT.

When a transistor with a heterojunction is made by the known method, heat treatments are found to be necessary in practice after the carbon implantation in order to restore damage in the base-emitter junction or in the base region, or to activate or diffuse the dopant atoms. After such a heat treatment, however, a number of recombination centers remains in the surface zone, which adversely affects the efficiency and the switching speed of the heterojunction transistor. It is further found in practice with heat treatments above approximately 800° C. that the provided dopant atoms diffuse from the surface zone, so that a zone implanted with carbon and a zone implanted with the dopant atoms do not coincide. Thus it may happen as a result of the diffusion of dopant atoms from the surface zone, for example, that a junction between the surface zone of greater bandgap and the semiconductor body of smaller bandgap does not coincide with a junction between n-type and p-type material. Instead of a heterojunction, a normal pn junction would then be created in the case of an emitter-base junction of a HBT. It is also found to be difficult in practice to implant a comparatively shallow surface zone with carbon atoms because carbon atoms on account of their small size already penetrate deeply into a material during implantation at low implantation energies; thus a carbon atom penetrates a silicon semiconductor body by as much as 0.3 $\mu m$ deep at an implantation energy of 100 keV.

SUMMARY OF THE INVENTION

The invention has for its object inter alia to counteract the said disadvantages.

According to the invention, the method is for this purpose characterized in that halogen atoms are provided simultaneously with the carbon atoms by means of an implantation with ions of a carbon-halogen compound, after which a heat treatment is carried out such that non-bonded halogen atoms are removed from the surface zone.

It is achieved by this that the number of recombination centers in the material of the surface zone is very low after heat treatments above approximately 800° C. It is found that free or "dangling" bonds arise in the surface zone during implantation. These dangling bonds can form recombination centers for charge carriers. The halogen atoms passivate these dangling bonds through the formation of Si-halogen compounds. Since dopants have a certain affinity to halogens, diffusion of dopant atoms from the implanted surface zone is strongly decelerated, so that the dopant atoms provided substantially do not diffuse from the surface zone and a "sharp" doping profile is created. The junction between the surface zone of greater bandgap and the semiconductor body of smaller bandgap on the one hand and the junction between n-type and p-type material on the other hand then coincide, whereby a hetero pn junction arises. Shallow implantations are possible by the method according to the invention, while nevertheless comparatively high implantation energies can be used. Carbon-halogen compound ions dissociate upon hitting the surface of the semiconductor body during their implantation. The implantation energy is then distributed over the carbon and halogen atoms of the compound in proportion to their masses. Owing to this distribution of the energy over several atoms, the penetration depth of the carbon and halogen becomes less than when the entire implantation energy is concentrated in one atom. Moreover, since this distribution is proportional to the masses of carbon and the halogen, the carbon and the halogen have substantially the same penetration depth, so that both carbon and halogen atoms are provided throughout the entire surface zone. It is surprisingly found that the quantity of halogen atoms is not a critical factor. Nonbonded halogen atoms, which are not used for forming Si-halogen compounds during the passivation of the surface zone, are removed from the surface zone by a heat treatment through diffusion to the surface of the semiconductor body, where these atoms are removed.

It is noted that the use of fluorine as a means of replacing Si-H compounds by more stable Si-F compounds is known in the provision of an emitter region of a HBT in the form of a "chemical vapor deposition" (CVD) layer on a silicon semiconductor body. See "Si Hetero-Bipolar Transistor with a Fluorine-Doped SiC Emitter and a Thin, Highly Doped Epitaxial Base" by T. Sugii et at., IEEE Trans. Electron Devices, vol. 37, no. 11, Nov. 1990, pp. 2331–2335. After the emitter region has been provided by CVD, a layer with a fixed ratio of silicon, carbon, fluorine and dopant is provided. This layer is not subjected to further heat treatments at a temperature higher than the temperature during CVD. Such an emitter region has an interface between the emitter and base regions which is very difficult to control.

The halogen used may be, for example, fluorine, chlorine, or bromine. Preferably, the method according to the invention is characterized in that fluorine is used as the halogen. The fluorine atoms form a more stable compound with the silicon atoms of the semiconductor body than do chlorine or bromine atoms, so that the material of the surface zone is more stable at higher temperatures.

Examples of carbon-halogen compounds which may be used are: $CF^+$, $CF_2^+$, $CF_3^+$ compounds comprising two carbon atoms, compounds comprising chlorine or bromine as the halogen, or compounds comprising other atoms such as, for example, nitrogen or oxygen atoms. An additional advantage is obtained when $CF_3^+$ ions are used as ions of the carbon-halogen compound. The implantation energy is then a minimum at a given acceleration voltage of the implantation machine because the compound is positive-monovalent, while this energy is distributed over one carbon atom and three fluorine atoms, so that the energy per atom is comparatively low. In addition, $CF_3^+$ ions are comparatively easy to manufacture, so that implantation is simple.

Preferably, the implantation of the carbon-halogen compound ions takes place to a depth of less than 0.15 $\mu$m below the surface. The depth of the heterojunction, i.e. the depth of the surface zone is then less than 0.15 $\mu$m. It is possible to make the electrical resistance of the surface zone in a direction perpendicular to the surface of the semiconductor small with such a shallow surface zone. An emitter of a HBT may thus be made which has a low emitter resistance, so that electrical losses in the HBT are small. An implantation of $CF_3^+$ ions with an acceleration voltage of 100 keV, for example, leads to a heterojunction and thus to a surface zone with a depth of 0.12 $\mu$m.

Preferably, the temperature is chosen to be above 800° C. during the heat treatment. A quick evaporation of the excess implanted halogen atoms is safeguarded at such temperatures. For example, a heat treatment for five minutes at 900° C. is sufficient for evaporating the excess implantated halogen atoms.

The dopant atoms are provided in the surface zone through diffusion or through implantation and activation. Diffusion and activation take place at raised temperature. Preferably, the heat treatment for the removal of the non-bonded halogen atoms is also used for diffusing or activating the dopant atoms. Only one heat treatment is necessary in this manner.

The dopant atoms may be provided either before or after the implantation of the carbon atoms, as desired. An additional advantage is obtained when the dopant atoms are provided after the implantation with ions of the carbon-halogen compound. The material of the surface zone is rendered practically amorphous by the implantation. The dopant atoms are then no longer capable of penetrating the semiconductor body more deeply than the surface zone through, for example, "channelling". In addition, the dopant atoms are inhibited in their diffusion outside the surface zone by their affinity to halogens.

The surface zone may be contacted by means of, for example, a polysilicon layer. Contacting of the surface zone with a metal layer is comparatively difficult. Preferably, fewer carbon and halogen atoms are provided in the surface zone in a region adjoining the surface of the semiconductor body than deeper in the surface zone, while a metal layer is provided on the surface after the heat treatment. A region comprising comparatively few carbon and halogen atoms is thus created at the surface of the semiconductor body. A better electrical connection with a metal layer can be made with such a region than with a region in which comparatively many carbon and halogen atoms are provided. The depth of this region is, for example, approximately 10 nm. As the metal layer, for example, a usual double layer comprising a TiW adhesion layer and an Al contact layer may be provided.

BRIEF DESCRIPTION OF THE DRAWING

The invention is explained in more detail below by way of example with reference to several embodiments and the accompanying diagrammatic drawing, in which.

The Figures are purely diagrammatic and not drawn to scale. Corresponding parts in the Figures are generally given the same reference numerals.

DESCRIPTION OF THE PREFERRED EMBODIMENT

Figure 1:
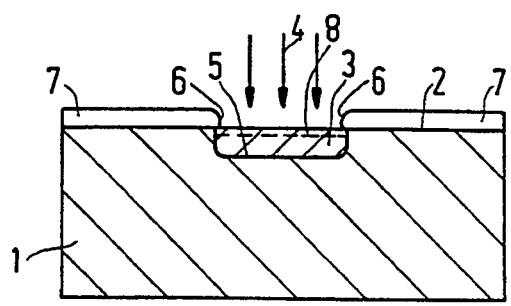
FIGS. 1 and 2 show stages in the manufacture of a heterojunction diode according to the invention.

FIG. 1 shows a stage in the manufacture of a semiconductor device whereby a surface zone 3 adjoining a surface 2 is formed in a silicon semiconductor body 1 through the local provision of carbon atoms 4 and dopant atoms, the carbon atoms being provided by implantation.

The surface zone 3 becomes substantially entirely amorphous owing to the implantation with carbon ions 4. The material of the surface zone 3 then has a greater bandgap than the monocrystalline silicon of the semiconductor body 1. Dopant atoms are provided in usual manner through diffusion or implantation in order to define the conductivity type (n or p type) of the surface zone 3. The surface zone 3 is provided with dopant atoms, for example of a type opposite to the dopant atoms of the semiconductor body 1, before or after the carbon implantation. A hetero pn junction 5 is thus created between the surface zone 3 and the semiconductor body 1. The carbon and the dopant atoms are locally provided by usual techniques, for example, by implantation through a window 6 provided in an oxide layer 7. The hetero pn junction 5 may act, for example, as an emitter-base junction of a heterojunction bipolar transistor (HBT). Such transistors are very efficient because the charge carriers injected in forward direction are transmitted by the heterojunction and charge carriers injected in reverse direction are decelerated.

It is found in practice that the carbon ions 4 penetrate relatively deeply into the semiconductor body 1 and cause damage at the hereto pn junction 5, and also in the semiconductor body 1 below the junction 5. Thus, at an implantation energy of 100 keV, a carbon atom already penetrates 0.3 $\mu$m deeply into a silicon semiconductor body 1 and causes damage to the silicon lattice there. A heat treatment is therefore usually necessary for restoring this comparatively deep-lying damage. A heat treatment may also be necessary, for example, for activating implanted dopant atoms. After such a heat treatment, however, a number of recombination centers remain. The switching speed and the efficiency of a transistor with heterojunction are below optimum as a result. It is further found in practice that the provided dopant atoms diffuse from the surface zone 3 into the semiconductor body 1 with heat treatments above approximately 800° C., so that junctions between regions of greater and smaller bandgap and between regions with p-type and n-type doping do not coincide.

According to the invention, therefore, halogen atoms are provided simultaneously with the carbon atoms by means of an implantation with ions of a carbon-halogen compound, after which a heat treatment is carried out such that nonbonded halogen atoms are removed from the surface zone 3.

Free or "dangling" bonds of silicon, which can form recombination centers, are passivated by the measure according to the invention through the formation of silicon-halogen compounds. Such compounds are very stable at temperatures above approximately 800° C., so that the number of recombination centers becomes minimal after a heat treatment. Diffusion of dopant atoms from the implanted surface zone 3 is strongly decelerated because dopant atoms have a great affinity to halogen atoms. A doping profile then arises which is strongly limited by the presence of the halogen atoms, as a result of which the transition between regions of greater and smaller bandgap coincides with the transition between regions with p-type and n-type doping, and a hetero pn junction 5 is created. Shallow implantations are possible at comparatively great implantation energies with the method according to the invention. This is because the ions of the carbon-halogen compound dissociate upon hitting the surface 2 of the semiconductor body 1. The implantation energy is then distributed over the carbon and halogen atoms of the compound in proportion to their masses. The carbon and the halogen then have practically the same penetration depth, so that both carbon and halogen atoms are provided over the entire surface zone 3. It is surprisingly found that the quantity of halogen atoms is not a critical factor. It is found in practice that, when the quantity of carbon atoms and the quantity of halogen atoms are practically the same, this is sufficient for achieving the said advantages. Halogen atoms not used for forming Si-halogen compounds in the passivation of the surface zone 3 are practically non-bonded. These halogen atoms are removed from the surface zone 3 by the heat treatment.

The halogen used may be, for example, fluorine, chlorine, or bromine. Preferably, however, fluorine is used as the halogen. The fluorine atoms form a more stable compound with the silicon atoms of the semiconductor body than do the chlorine or bromine atoms, so that the material of the surface zone is more stable at higher temperatures.

Examples of carbon-halogen compounds which can be used are: compounds with one, two or more carbon atoms, compounds comprising fluorine, bromine or chlorine as the halogen, or the said compounds with in addition other atoms such as, for example, nitrogen or oxygen atoms. Nitrogen and oxygen atoms are also capable of increasing the bandgap of the material of the surface zone 3 as compared with silicon. Preferably, $CF_3^+$ ions are used as the ions of the carbon-halogen compound. The implantation energy is a minimum for a given acceleration voltage of the implantation machine in that case because the compound is positive-monovalent, while the said energy is distributed over one carbon atom and three fluorine atoms, so that the energy per atom is comparatively low. In addition, implantation is comparatively easy to realise with $CF_3^+$ ions.

Preferably, the implantation of the ions of the carbon-halogen compound takes place to a depth of less than 0.15 μm below the surface. The hetero pn junction 5 then lies at a depth of less than 0.15 μm below the surface 2. Since the electrical resistance of the surface zone 3 in a direction perpendicular to the surface 2 is directly proportional to the depth of the surface zone 3, a small electrical resistance of the surface zone 3 can be realised through a small depth of the surface zone 3. This is especially important when the surface zone 3 is used as the emitter region of an HBT. The electrical losses in the HBT will then be comparatively small. For example, the heterojunction 5 will lie at a depth of 0.12 μm below the surface 2 with an implantation of $CF_3^+$ ions at an acceleration voltage of 100 keV.

Preferably, the temperature is chosen to be above 800° C. during the heat treatment. The non-bonded implanted halogen atoms can be removed comparatively quickly at such temperatures. For example, a heat treatment of 5 minutes at 900° C. after an implantation of $3 \times 10^{16}$ $CF_3^+/cm^2$ is sufficient for removing the non-bonded fluorine atoms and for retaining approximately $3 \times 10^{16}$ fluorine/$cm^2$ in the surface zone 3.

The dopant atoms are provided through diffusion or through implantation and activation. Diffusion and activation take place at increased temperature. Preferably, the heat treatment for the removal of the non-bonded halogen atoms is also used for diffusing or activating the dopant atoms. The heat treatment may take place in usual manner in a furnace, or by means of a so-called rapid thermal anneal process.

The dopant atoms may be provided either before or after the implantation of the carbon atoms. An additional advantage is obtained when the dopant atoms are provided after the implantation with ions of the carbon-halogen compound. The implantation renders the material of the surface zone practically entirely amorphous. The dopant atoms then can no longer penetrate into the semiconductor body 1 beyond the surface zone 3 through channels in the silicon lattice ("channelling"). Since the halogen atoms are already present during the provision of the dopant atoms, the dopant atoms are decelerated in their diffusion outside the surface zone 3 by their affinity to halogens.

Figure 2:
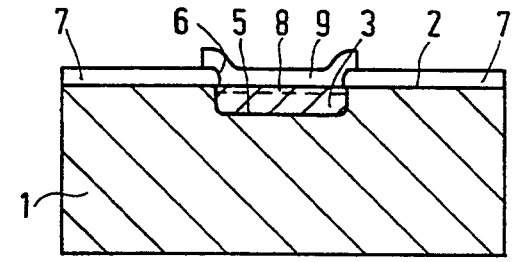
Figure 3:
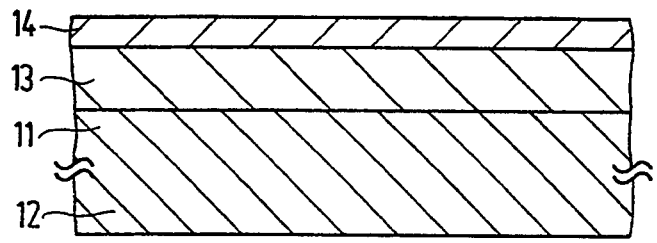
FIGS. 3 to 6 show different stages in the manufacturing process of a HBT according to the invention.

Preferably, fewer carbon and halogen atoms are provided in the surface zone 3 in a region 8 adjoining the surface 2 of the semiconductor body 1 than deeper in the surface zone 3, while a metal layer 9 is provided on the surface 2 (see FIG. 2) after the heat treatment. A region 8 comprising comparatively few carbon and halogen atoms is created thereby at the surface 2 of the semiconductor body. A better electrical connection can be made to such a region 8 than to a region 3 having a comparatively great bandgap in which comparatively many carbon and halogen atoms are provided. This is because a material having a comparatively great bandgap is difficult to contact with a metal layer because of the so-called Schottky barrier. A region 8 with a depth of, for example, 10 nm may be made through a suitable choice of the implantation energy and dose, for example, $5 \times 10^{16}/cm^2$ $CF_3^+$ implantation at 45 keV. This region 8 becomes polycrystalline after the heat treatment. Contacting of this polycrystalline silicon is comparatively easy. The metal layer provided may be, for example, a conventional aluminium layer 9.

Figure 4:
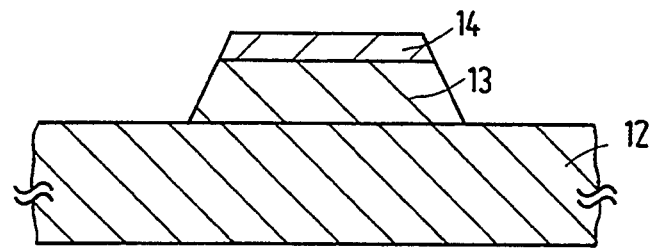
Figure 5:
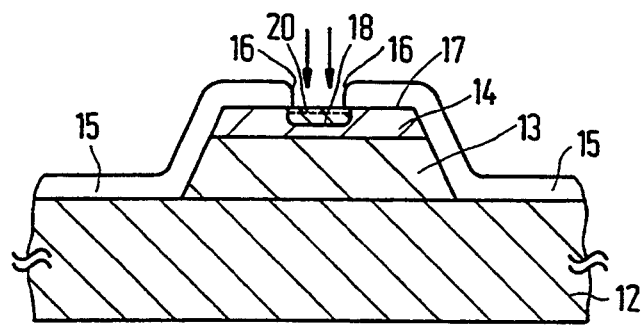
Figure 6:
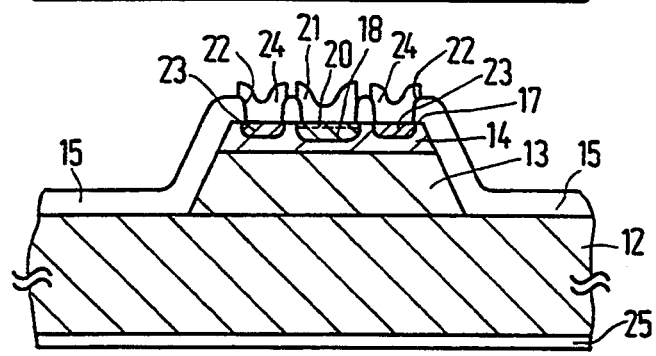

The manufacture of an npn heterojunction bipolar transistor (HBT) is now described by way of example. FIGS. 3 to 6 show different stages in the manufacture of this HBT. An n-type silicon semiconductor body 11 comprising a comparatively highly doped (n+) substrate 12 and a less highly doped (n−) layer 13 provided on the substrate through epitaxy is provided in usual manner with a base layer 14 by implantation of B ions (see FIG. 3). The base layer 14 forms the base region of the transistor. In a next step, a mesa structure is realised in the n−layer 13 and in the base layer 14 (see FIG. 4) by means of usual photolithographic and etching techniques. The mesa structure of FIG. 4 is covered by the provision of an oxide layer 15, for example, through dissociation of tetraethoxysilane (TEOS) from the gas phase (see FIG. 5). A window 16 is locally etched into this oxide layer 15 by usual techniques. A surface zone 18 adjoining a surface 17 is formed through this window 16 by the simultaneous provision of carbon and fluorine atoms in an implantation of $5 \cdot 10^{16}/cm^2$ $CF_3^+$ions at an energy of 45 keV. After the $CF_3^+$implantation, phosphorus is provided as the dopant atom in an implantation of $5 \cdot 10^{15}$ P/cm$^2$ at an energy of 50 keV. The surface zone 18 is then approximately 0.1 μm deep, while in a region 20 approximately 10 nm deep below the surface 17 fewer carbon and fluorine atoms are present than deeper in the surface zone 18. The semiconductor device is subsequently given a heat treatment for 30 minutes at 900° C. for activating the dopant atoms, restoring any damage, and removing any non-bonded fluorine atoms. After the heat treatment, the fluorine concentration in the surface zone 18 is approximately $5 \times 10^{16}/cm^2$. The surface zone 18 acts as the emitter region of the HBT. A window is then provided in the oxide layer at some distance from the emitter contact 21. A p+ region 23 is provided through this window by means of a B implantation in usual manner for contacting the base region 14. The emitter and base region 21 and 23 are provided with contact connections 21 and 24, respectively, in usual manner, in the present example made of aluminium. The lower side of the substrate 12 is also provided with a conducting aluminium layer 25 serving as the collector connection. The HBT may be finished in usual manner by mounting on a connection frame and enveloping in synthetic material.

The invention is not limited to the embodiment described above, but can also be used in, for example, IC applications or in integrated injection logic (I$^2$L), where a heterojunction is desired because of the higher efficiency. The material of the surface zone having a bandgap greater than that of silicon may also be used in the barriers of tunnelling hot electron transistors.

We claim:

1. A method of manufacturing a semiconductor device wherein a surface zone is formed adjoining a surface of a silicon semiconductor body by locally providing carbon and dopant atoms, the carbon atoms being provided through implantation, characterized in that halogen atoms are provided simultaneously with the carbon atoms by means of an implantation with ions of a carbon-halogen compound, after which a heat treatment is carried out to remove non-bonded halogen atoms from the surface zone.

2. A method as claimed in claim 1, characterized in that fluorine is used as the halogen.

3. A method as claimed in claim 2, characterized in that $CF_3^+$ions are used as ions of the carbon-halogen compound.

4. A method as claimed in claim 1, characterized in that the implantation of the carbon-halogen compound ions takes place to a depth of less than 0.15 μm below the surface.

5. A method as claimed in claim 1, characterized in that the temperature is chosen to be above 800° C. during the heat treatment.

6. A method as claimed in claim 1, characterized in that the heat treatment for the removal of the non-bonded halogen atoms is also used for diffusing or activating the dopant atoms.

7. A method as claimed in claim 1, characterized in that the dopant atoms are provided after the implantation with ions of the carbon-halogen compound.

8. A method as claimed in claim 1, characterized in that fewer carbon and halogen atoms are provided in a region of the surface zone adjoining the surface of the semiconductor body than deeper in the surface zone, and a metal layer is provided on the surface after the heat treatment.

* * * * *